United States Patent [19]

Joshi

[11] 4,401,956
[45] Aug. 30, 1983

[54] ELECTRONICALLY VARIABLE TIME DELAY IN PIEZOELECTRIC MEDIA

[76] Inventor: Shrinivas G. Joshi, 4344 Regal Ct., New Berlin, Wis. 53151

[21] Appl. No.: 302,222

[22] Filed: Sep. 14, 1981

[51] Int. Cl.³ .............. H01P 9/42; H01P 9/38; H01P 9/68
[52] U.S. Cl. ............. 333/152; 310/313 D; 333/153
[58] Field of Search .............. 333/150–155; 310/313 R, 313 A, 313 B, 313 C, 313 D; 29/25.35; 332/26; 331/107 A

[56] References Cited

U.S. PATENT DOCUMENTS

| | | | |
|---|---|---|---|
| 3,723,915 | 3/1973 | Adler et al. | 333/152 |
| 4,340,872 | 7/1982 | Alter | 333/150 X |
| 4,342,971 | 8/1982 | Councilman et al. | 333/152 |

OTHER PUBLICATIONS

Gulyaev—"Effect of an External Electric Field on the Velocity of a Surface Acoustic Wave in a Lithium Niobate Single Crystal", Sov. Tech. Phys. Lett. vol. 1, No. 9, Sep. 1975; pp. 346–347.
Shimizu et al.—"Unidirectional Surface-Acoustic-Wave Transducers with a $Z_nO$ Film on a Glass Substrate" Electronics Letters Jun. 23, 1977, vol. 13, No. 13; p. 384.
Bond et al.—"Surface Acoustic Wave Probing with Spaced Interdigital Transducers", Rev. Sci. Instrum., vol. 48, No. 6, Jun. 1977; pp. 682–687.

Primary Examiner—Marvin L. Nussbaum
Attorney, Agent, or Firm—Andrus, Sceales, Starke & Sawall

[57] ABSTRACT

A variable delay line for surface acoustic waves includes spaced input and output transducers affixed on the wave-propagating surface of a piezoelectric substrate for sending and receiving acoustic waves. An AC or DC voltage is applied to the substrate through a pair of electrodes as a strain inducing signal. The applied voltage changes the time delay of the wave by physically altering the length of the propagation path, and/or by altering the effective properties of the substrate to vary the propagation velocity of the wave. The time delay will vary proportionately in response to the applied voltage.

2 Claims, 5 Drawing Figures

ELECTRONICALLY VARIABLE TIME DELAY IN PIEZOELECTRIC MEDIA

BACKGROUND OF THE INVENTION

The present invention relates to delay lines for acoustic waves and more particularly to a variable delay line for surface acoustic waves.

In piezoelectric SAW (surface acoustic wave) devices, the time delay of the acoustic wave between the input and the output transducers is determined by the length of the propagation path between the transducers and by the propagation velocity of the wave between the transducers. The length of the propagation path and the propagation velocity are both modified by strain induced in the propagation medium. Thus strain produces a change in the time delay and this effect can be used to vary the performance of SAW devices. In early arrangements utilizing this phenomenon, the strain was produced by applying an external mechanical stress to the propagation medium. In a piezoelectric medium strain may also be produced by applying an electric field. The use of an electric field is attractive because it would permit extremely accurate electronic tuning of SAW devices.

Various other methods of varying the time delay of SAW devices have been developed in the past. One method was to short circuit the piezoelectric field associated with the surface wave to lower the elastic stiffness to the propagation medium and thus decrease the propagation velocity. In such devices, the shorting effect was controlled with a DC electric field by changing the distance between a metal film and the wave propagating surface or by changing the surface conductivity of a silicon wafer placed in close proximity to the wave propagating surface. These devices, however, suffer from the disadvantage that some means of mechanically supporting the silicon wafer or the metal film in close proximity to the wave propagating surface is required.

Another method of controlling the time delay involves the use of a poled ferroelectric ceramic such as PZT (lead zirconate titanate). In such devices, the time delay may be changed by electrically changing the residual polarization of the ceramic substrate on which the surface wave is propagating. See for example, Thomann, U.S. Pat. No. 3,170,465. However, in devices such as Thomann's the application of an electric field to a polarized ceramic produces an irreversible change in the polarization of the ceramic substrate and thus irreversibly changes the properties of the propagation medium and hence irreversibly changes the time delay. Such an irreversible change in the properties of the propagation medium and in the time delay will not be useful in many desired applications. Further, ferroelectric ceramics such as PZT have an undesirable hysterisis or creep characteristic. Thus, the change in time delay will show "relaxation" effects. That is, the time delay will change with time even when the polarizing electric field is held constant. Also, ferroelectric ceramics have other disadvantages such as high acoustic attenuation, lack of good surface finish, and lack of reproducible material properties.

Another method of controlling the time delay is based on the difference in the surface wave velocity for two states of polarization of a ferroelastic-ferroelectric material. The boundary between the two states of polarization in such a material is referred to as the domain wall and control of the surface wave velocity is achieved by electrically controlling the position of the domain wall. Examples of such materials are beta-terbium molybdate and beta-gadolinium molybdate. SAW devices of this type are, however, restricted to the use of such special ferroelastic-ferroelectric materials which may not always be compatible with other requirements such as high coupling coefficient, low attenuation, and availability of crystals of the required size. Another limitation of this technique is that the domain wall of these materials moves at a very slow velocity (typically a few mm/sec) so that the device has a slow speed of response.

SUMMARY OF THE INVENTION

The present invention provides an improved variable delay line for electronically tuning the time delay of acoustic waves. The delay line includes spaced input and output transducer means for sending and receiving surface acoustic waves on the surface of a piezoelectric substrate, and electrode means disposed on the substrate which are connected to the source of a biasing or control voltage. The control voltage is applied to the substrate through the electrode means. The time delay of the device will vary in response to the applied control voltage.

The electric field produced by the biasing voltage changes the time delay by two mechanisms: (i) the electric field produces a strain in the medium which can lead to a change in the length of the propagation path, and (ii) the electric field modified the effective elastic, piezoelectric, and dielectric constants of the propagation medium and thus leads to a change in the propagation velocity. In a given material either one or both of these effects may be present.

The present invention may be utilized with a broad range of piezoelectric materials, and is not limited to a special class of materials such as piezoelectric ceramics or ferroelastic-ferroelectric materials. As a result, the present invention has a broad range of applications and may be utilized with readily available and widely used piezoelectric materials such as $LiNbO_3$ (lithium niobate), $LiTaO_3$ (lithium tantalate), $Bi_{12}GeO_{20}$ (bismuth germanium oxide), and quartz which have low attenuation and good surface characteristics. The invention may also be utilized with layered media consisting of a thin film deposited on a substrate. In the case of layered media, either the substrate or the thin film should have piezoelectric properties. The invention may be utilized with either a time varying (AC) or DC electric field.

The main advantages of the present invention are the following. First, this technique of electronically controlling the time delay can be used with a wide range of piezoelectric materials and is not restricted to special materials such as piezoelectric ceramics or ferroelastic-ferroelectric materials. The technique can also be used with layered media consisting of a thin film deposited on the substrate. Second, the time delay can be varied rapidly (within a few microseconds) in response to the biasing voltage. Finally, the power needed to change the time delay is negligible because the biasing voltage is applied across the piezoelectric substrate, which is a very good insulator.

In another aspect of the invention, a thin film is deposited on the substrate and the biasing electric field is applied across the thin film. In such a device, either the substrate or the thin film may be comprised of piezoelectric material. The film is only a few micrometers thick and therefore a small voltage (typically 5-20 volts for a film thickness of 0.2-0.5 micrometers) is adequate to cause a significant change in the time delay.

The present invention thus provides an improved technique for electronically tuning the time delay of surface acoustic waves. The time delay is variable in response to varying applied voltages with an extremely fast response time.

Other objects and advantages of the present invention will appear during the course of the following description.

BRIEF DESCRIPTION OF THE DRAWINGS

The drawings illustrate the best mode presently contemplated of carrying out the invention.

In the drawings.

DESCRIPTION OF THE PREFERRED EMBODIMENT

Figure 1:
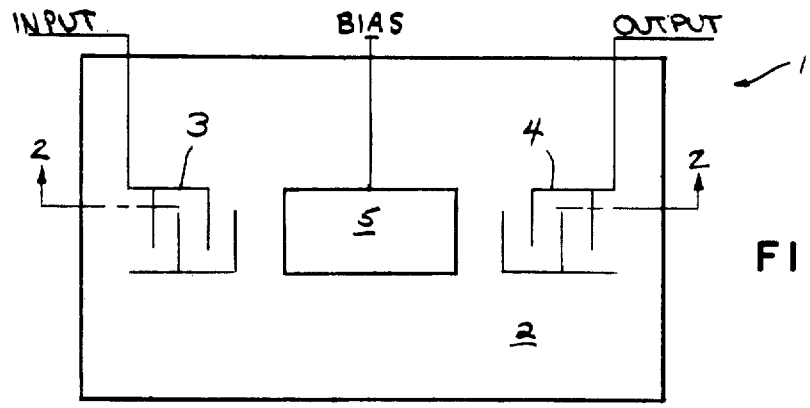
FIG. 1 is a plan view of a variable delay line constituting a preferred embodient of the present invention.
Figure 2:
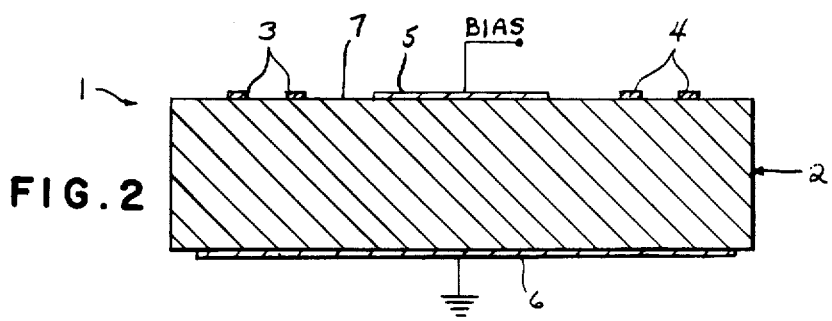
FIG. 2 is a cross sectional view of the delay line of FIG. 1.

Referring now to the drawings, FIGS. 1 and 2 show an SAW (surface acoustic wave) device constructed in accordance with the principles of the present invention. It should be noted that although the present invention will be described with specific reference to an SAW device, the principles of the present invention are also applicable to delay lines that use other types of acoustic waves. For example, the principles of the present invention can also be applied to SSBW (surface skimming bulk wave) devices, SBAW (shallow bulk acoustic wave) devices, line acoustic wave devices, and Bluestein-Gulyayev wave devices.

The SAW device 1 includes a piezoelectric substrate or crystal 2, input and output transducers 3 and 4, respectively, and a pair of electrodes 5 and 6 positioned on the substrate. The substrate 2 is composed of a piezoelectric material, such as lithium niobate (LiNbO$_3$), lithium tantalate (LiTaO$_3$), bismuth germanium oxide (Bi$_{12}$GeO$_{20}$), quartz, as well as other materials well known in the art. As shown, substrate 2 is in the conventional block form having a wave-propagating surface 7 that is optically polished in the conventional manner.

Substrate 2 is provided with input transducer 3 and output transducer 4 on the wave-propagating surface 7. The transducers 3 and 4 are comprised of interleaved interdigital fingers or combs affixed to the surface 7 in the conventional manner, such as by vacuum evaporation process or an appropriate etching process as is well known in the art. Input transducer 3 converts electric signals to acoustic waves which travel along the surface 7 to output transducer 4 where they are reconverted into electric ignals. The distance between transducers 3 and 4 is generally referred to as the length of the propagation path and the time of propagation between transducers 3 and 4 is generally referred to as the delay time of the acoustic waves.

Substrate 2 is also provided with a pair of electrodes 5 and 6 thereon for producing a biasing electric field in the propagation medium. The electrode arrangement shown in FIGS. 1 and 2 will produce a biasing electric field which is essentially perpendicular to the propagation surface. However it should be noted that as far as the principles of the present invention are concerned, the biasing electric field can be parallel, perpendicular, or at any arbitrary angle to the direction of wave propagation. The optimum orientation of the electric field to be used will vary depending on the substrate material. The shape and position of electrodes 5 and 6 can be designed to produce a desired electric field by techniques well known in the art. It should be noted that electrodes 5 and 6 need not be in contact with the substrate but could be separated from it. The function of electrodes 5 and 6 is to produce a biasing electric field in the propagation medium. Electrodes 5 and 6 may be composed of any conventional materials, such as aluminum, gold, copper or silver with electrode 5 disposed on the wave-propagating surface 7 in the propagation path of the acoustic waves between input transducer 3 and output transducer 4, as shown. Electrode 6, as shown in FIG. 2, is positioned on the opposite surface from that of surface 7. Electrodes 5 and 6 are preferably a thin film of conducting material deposited on substrate 2 by well known vacuum evaporation or other convenient technique well known in the art.

Figure 3:
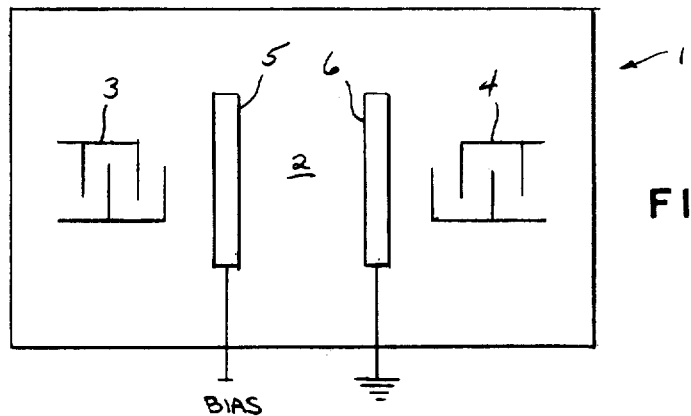
FIG. 3 is a plan view of a variable delay line constituting a second embodiment of the present invention.

As shown in FIG. 3, the electrodes 5 and 6 may also be positioned so that the length is perpendicular to the direction of wave propagation. It is readily obvious to those skilled in the art that electrodes 5 and 6 may take other shapes such as gratings or inter-leaved interdigital fingers, similar to the input and output transducers 3 and 4, and may be deposited in any position on substrate 2. Thus, electrodes 5 and 6 may be on opposite surfaces, as shown in FIG. 2, or on the same surface 7 as shown in FIG. 3, or even on the sides of substrate 2. The electrodes 5 and 6 may take shapes other than those shown, and may be deposited in a variety of positions on substrate 2. For exampke, instead of being positioned in the propagation path as shown in FIG. 3, electrodes 5 and 6 could be positioned outside the propagation path, or could be positioned so that they are parallel to, perpendicular to, or at any arbitrary angle to the propagation path. Also, electrodes 5 and 6 may be positioned outside of transducers 3 and 4 instead of between them as shown in FIG. 3. For purposes of illustration, only two of the various possibilities are shown in FIGS. 2 and 3. However, various other combinations are readily obvious to those skilled in the art.

Each of the electrodes 5 and 6 are provided with appropriate electrical leads which are connected to a source of variable voltage that may be applied to the substrate 2 through electrodes 5 and 6. The source of voltage may be either positive or negative DC voltage, or may be an AC voltage source. The biasing voltage may be applied either to electrode 5 or to electrode 6.

In operation, input transducer 3 converts the input electrical signal into an acoustic surface wave which propagates along the surface 7 of substrate 2. When the wave reaches the output transducer 4, it is converted back to an electrical signal. For various applications, it is desirable to electrically control the time delay of the acoustic wave. Some such applications might be (1) beam steering or beam forming in phased array antennas, (2) measurement of high voltages, (3) analog-to-digital conversion, and (4) compensation for temperature and aging effects in SAW devices. To vary the time delay the SAW device 1 applies an AC or DC bias through electrodes 5 and 6 to substrate 2. The electric field produces a change in the time delay by means of two mechanisms. First, since the substrate 2 is piezoelectric the electric field produces a strain in substrate 2 which may physically alter the length of the propagation path. Second, the biasing electric field modifies the effective elastic, piezoelectric and dielectric material properties of the piezoelectric medium, such as its modulus of elasticity and density to produce a change in the velocity of the surface acoustic waves. For example, in a 0.02 inch thick substrate 2 composed of $LiNbO_3$ with the transducers 3 and 4 spaced approximately 36 mm apart, fractional time delay changes up to 0.1 percent have been obtained using a biasing voltage of 5.5 kV.

As previously noted, the delay line is variable. This means that the length of the propagation path and the elastic and dielectric properties of the medium vary in response to varying applied voltages to proportionately change the time delay of the surface acoustic wave. In other words, for each change in the applied bias, the length of the propagation path and the effective material properties of the medium will also change in a predictable manner to provide a proportionate change in the time delay. Thus, the time delay is continuously variable within the limits of the applied bias. The response time of the SAW device 1 is extremely fast and the change in the time delay occurs within a few microseconds after the electric field is applied.

Figure 4:
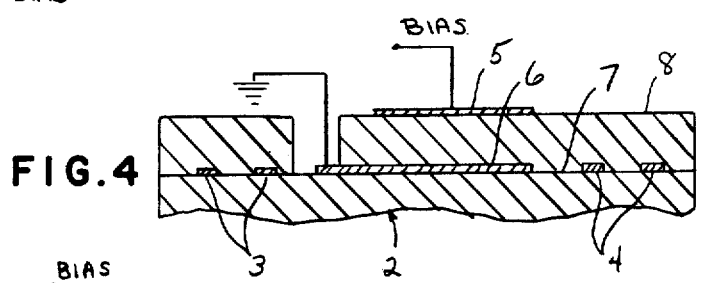
FIG. 4 is a fragmentary cross sectional view of a variable delay line constituting a third embodiment of the present invention.

FIG. 4 shows a third embodiment of the present invention. FIG. 4 shows a thin film SAW device in which the biasing electric field is applied across a thin film 8. The film could be a piezoelectric material such as zinc oxide, cadmium sulfide, or other suitable materials known in the art deposited on a non-piezoelectric substrate 2. It should be noted, however, that the thin film 8 could be of a non-piezoelectric material and the substrate 2 of piezoelectric material. Thus, either the thin film 8 or the substrate 2 must be composed of a piezoelectric medium and the other component can be non-piezoelectric. As shown, electrode 5 is affixed to the surface of thin film 8 and electrode 6 is disposed on surface 7 of substrate 2 beneath the film 8 and between transducers 3 and 4. Here electrodes 5 and 6 are shown as continuous metal electrodes, but they could also be in the form of gratings (that is, a number of parallel conducting fingers which are electrically connected together), or interleaved interdigital fingers. The SAW device shown in FIG. 4 operates in the same manner as previously described for FIGS. 1-3 so that a strain induced in the thin film 8 will result in a change in the time delay. Thin film 8 is extremely thin and typically has a thickness which may range from a fraction of a micrometer to a few micrometers. Therefore, only a small amount of biasing voltage need be applied to electrodes 5 and 6 to cause a change in the time delay of the surface acoustic wave.

Figure 5:
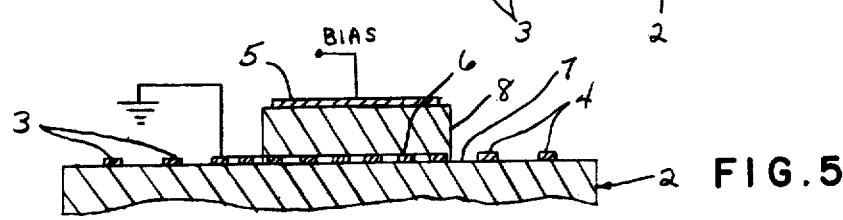
FIG. 5 is a fragmentary cross sectional view of a variable delay line constituting a fourth embodiment of the present invention.

FIG. 5 shows a fourth embodiment of the present invention which is similar to the third embodiment shown in FIG. 4. In the fourth embodiment, the substrate 2 is composed of a piezoelectric material and the thin film 8 could be of a non-piezoelectric material. As shown, electrode 6 is in the form of a grating, and electrode 5 could be either a continuous film or a grating. When a biasing voltage is applied between electrodes 5 and 6 a fringing electric field will be produced in the upper region of substrate 2. This electric field will produce a strain and cause a change in the time delay.

Preferred embodiments of an SAW device have been shown and described herein. The SAW devices may be utilized with a broad range of piezoelectric materials and has low attenuation, good surface characteristics and reliable and reproducible results.

Various modes of carrying out the invention are contemplated as being within the scope of the following claims particularly pointing out and distinctly claiming the subject matter which is regarded as the invention.

I claim:

1. A variable delay line for surface acoustic waves, comprising:

a piezoelectric substrate having a wave-propagating surface;

input and output transducer means affixed in spaced relation on said wave-propagating surface for sending and receiving surface acoustic waves on said surface;

electrode means for connection to a source of variable voltage for producing a biasing electric field in said substrate to cause a strain in said substrate to vary the time delay of said waves, said time delay changeable proportionately in response to varying applied voltages, said electrode means includes a first electrode in the form of a grating positioned on said wave-propagating surface, a non-piezoelectric thin film deposited on said wave-propagating surface over said first electrode, and said electrode means further includes a second electrode positioned on said thin film.

2. A variable delay line for surface acoustic waves, comprising:

a substrate element having a wave-propagating surface;

input and output transducer means affixed in spaced relation on said wave-propagating surface for sending and receiving surface acoustic waves on said surface;

electrode means for connection to a source of variable voltage for producing a biasing electric field in said substrate to cause a strain in said substrate to vary the time delay of said waves, said time delay changeable proportionately in response to varying applied voltages, said electrode means includes a first electrode positioned on said wave-propagating surface, a thin film element deposited on said wave-propagating surface over said first electrode, one of said elements composed of a piezoelectric material, and said electrode means further includes a second electrode positioned on said thin film.

* * * * *